(12) United States Patent
Ishibashi et al.

(10) Patent No.: US 10,797,169 B2
(45) Date of Patent: Oct. 6, 2020

(54) SILICON CARBIDE SEMICONDUCTOR DEVICE AND POWER CONVERSION APPARATUS

(71) Applicant: Mitsubishi Electric Corporation, Tokyo (JP)

(72) Inventors: Kazuya Ishibashi, Tokyo (JP); Atsushi Narazaki, Tokyo (JP); Yasuhiro Kagawa, Tokyo (JP); Kensuke Taguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/569,508

(22) Filed: Sep. 12, 2019

(65) Prior Publication Data

US 2020/0144409 A1 May 7, 2020

(30) Foreign Application Priority Data

Nov. 7, 2018 (JP) .................................. 2018-209347

(51) Int. Cl.
*H01L 29/78* (2006.01)
*H01L 29/16* (2006.01)
(Continued)

(52) U.S. Cl.
CPC .......... *H01L 29/7806* (2013.01); *H01L 28/20* (2013.01); *H01L 29/0865* (2013.01); *H01L 29/0882* (2013.01); *H01L 29/1095* (2013.01); *H01L 29/1608* (2013.01); *H01L 29/41741* (2013.01); *H01L 29/45* (2013.01); *H01L 29/7803* (2013.01); *H02M 1/08* (2013.01); *H02M 7/53871* (2013.01)

(58) Field of Classification Search
CPC ............. H01L 29/7806; H01L 29/1095; H01L 29/1608; H01L 29/41741; H01L 29/0882; H01L 29/45; H01L 29/7803; H01L 29/0865; H01L 28/20; H02M 7/53871; H02M 1/08
See application file for complete search history.

(56) References Cited

U.S. PATENT DOCUMENTS 7,436,031 B2 * 10/2008 Kitabatake .......... H01L 21/8213
257/379
9,627,525 B2 * 4/2017 Hiyoshi .............. H01L 29/7813
(Continued)

FOREIGN PATENT DOCUMENTS

WO 2014/038110 A1 3/2014

*Primary Examiner* — Kyle J Moody
(74) *Attorney, Agent, or Firm* — Studebaker & Brackett PC

(57) ABSTRACT

A drift layer contains first conductivity type impurities. A well region contains second conductivity type impurities. A source region is provided on the well region and contains the first conductivity type impurities. A well contact region is in contact with the well region, contains the second conductivity type impurities, and has an impurity concentration on the second surface higher than the impurity concentration on the second surface in the well region. A gate electrode is provided on a gate insulating film. A Schottky electrode is in contact with the drift layer. A source ohmic electrode is in contact with the source region. A resistor is in contact with the well contact region and has higher resistance per unit area than the source ohmic electrode.

14 Claims, 6 Drawing Sheets

(51) Int. Cl.
*H01L 29/417* (2006.01)
*H01L 29/10* (2006.01)
*H01L 29/08* (2006.01)
*H02M 1/08* (2006.01)
*H01L 29/45* (2006.01)
*H01L 49/02* (2006.01)
*H02M 7/5387* (2007.01)

(56) References Cited

U.S. PATENT DOCUMENTS

| | | | |
|---|---|---|---|
| 9,685,512 B2* | 6/2017 | Okawara | H01L 29/7397 |
| 10,128,370 B2* | 11/2018 | Ebihara | H01L 29/47 |
| 2013/0277688 A1* | 10/2013 | Nakano | H01L 21/046 |
| | | | 257/77 |
| 2015/0236012 A1 | 8/2015 | Hino et al. | |

* cited by examiner

F I G. 5
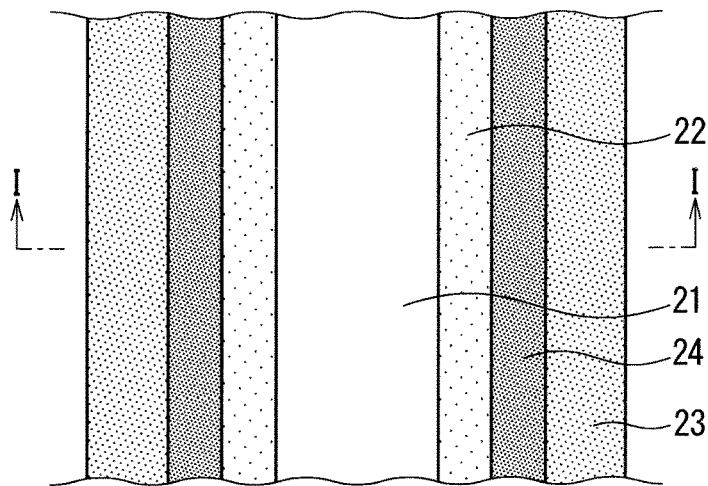
F I G. 6
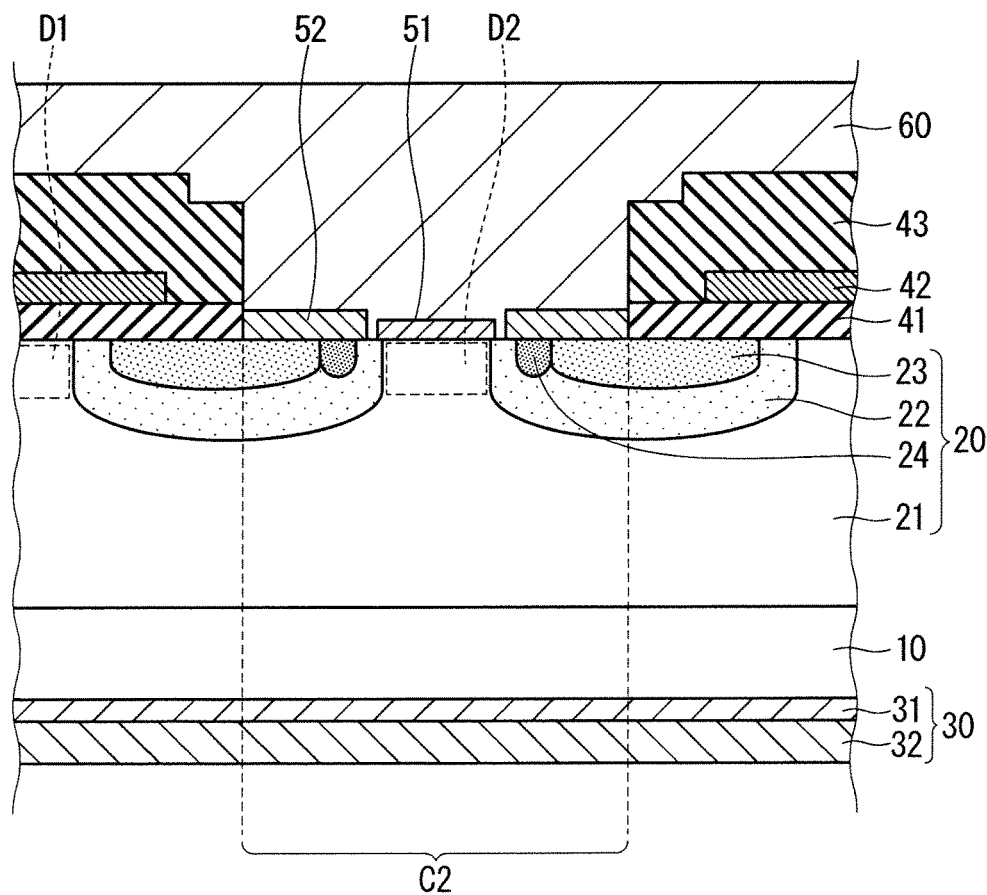

SILICON CARBIDE SEMICONDUCTOR DEVICE AND POWER CONVERSION APPARATUS

BACKGROUND OF THE INVENTION

Field of the Invention

The present invention relates to a silicon carbide semiconductor device and a power conversion apparatus, more particularly to a silicon carbide semiconductor device having a gate electrode and a Schottky electrode, and a power conversion apparatus including the silicon carbide semiconductor device.

Description of the Background Art

WO 2014/038110 discloses a metal oxide semiconductor field effect transistor (MOSFET) incorporating a Schottky barrier diode (SBD). The MOSFET includes a semiconductor layer made of silicon carbide (SiC). The semiconductor layer includes an n-type drift layer, a p-type well region, a p-type well contact region, and an n-type source region. The source ohmic electrode is in contact with each of the source region and the well contact region.

At the time of freewheeling operation of the MOSFET, not only the SBD operates but also a parasitic diode including a p-n junction between the well region and the drift layer operates. At this time, minority carriers are injected from the well region into the drift layer. When the minority carriers recombine, stacking faults of SiC crystals may grow. Device performance may deteriorate due to this stacking faults.

SUMMARY

The present invention is made to solve the above-described problems, and an object of the present invention is to provide a semiconductor device capable of reducing deterioration of device performance caused by stacking faults of SiC crystals.

A silicon carbide semiconductor device according to one aspect of the present invention includes a semiconductor substrate, a drain electrode, a semiconductor layer, a gate insulating film, a gate electrode, a Schottky electrode, a source ohmic electrode, a resistor, and a source electrode. The semiconductor substrate has a first substrate surface and a second substrate surface opposite to the first substrate surface, and contains first conductivity type impurities. The drain electrode is provided on the first substrate surface of the semiconductor substrate. The semiconductor layer has a first surface on the second substrate surface of the semiconductor substrate and a second surface opposite to the first surface, and is at least partially made of silicon carbide. The semiconductor layer includes a drift layer, a well region, a source region, and a well contact region. The drift layer is provided on the second substrate surface of the semiconductor substrate, partially forms the second surface of the semiconductor layer, and contains the first conductivity type impurities. The well region is provided on the drift layer, partially forms the second surface of the semiconductor layer, and contains second conductivity type different from the first conductivity type impurities. The source region is provided on the well region, is separated from the drift layer by the well region, partially forms the second surface of the semiconductor layer, and contains the first conductivity type impurities. The well contact region is in contact with the well region, partially forms the second surface of the semiconductor layer, contains the second conductivity type impurities, and has an impurity concentration on the second surface higher than the impurity concentration on the second surface in the well region. The gate insulating film covers the well region between the source region and the drift layer. The gate electrode is provided on the gate insulating film. The Schottky electrode is in contact with the drift layer. The source ohmic electrode is in contact with the source region on the second surface of the semiconductor layer. The resistor is in contact with the well contact region on the second surface of the semiconductor layer and has higher resistance per unit area than the source ohmic electrode. The source electrode is electrically connected to each of the Schottky electrode, the source ohmic electrode, and the resistor.

According to a silicon carbide semiconductor device according to one aspect of the present invention, a resistor in contact with the well contact region is provided. Electric resistance of the resistor reduces the amount of minority carriers injected into the drift layer through the well contact region at the time of freewheeling operation of the silicon carbide semiconductor device. Thus, growth of stacking faults of silicon carbide crystals due to recombination of minority carriers is reduced. Therefore, it is possible to reduce deterioration of device performance due to the stacking faults of silicon carbide crystals.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a top view illustrating a modified example in FIG. 2;

FIG. 6 is a partial cross-sectional view schematically illustrating a configuration of a silicon carbide semiconductor device in a second preferred embodiment of the present invention;

DESCRIPTION OF THE PREFERRED EMBODIMENTS

Figure 1:
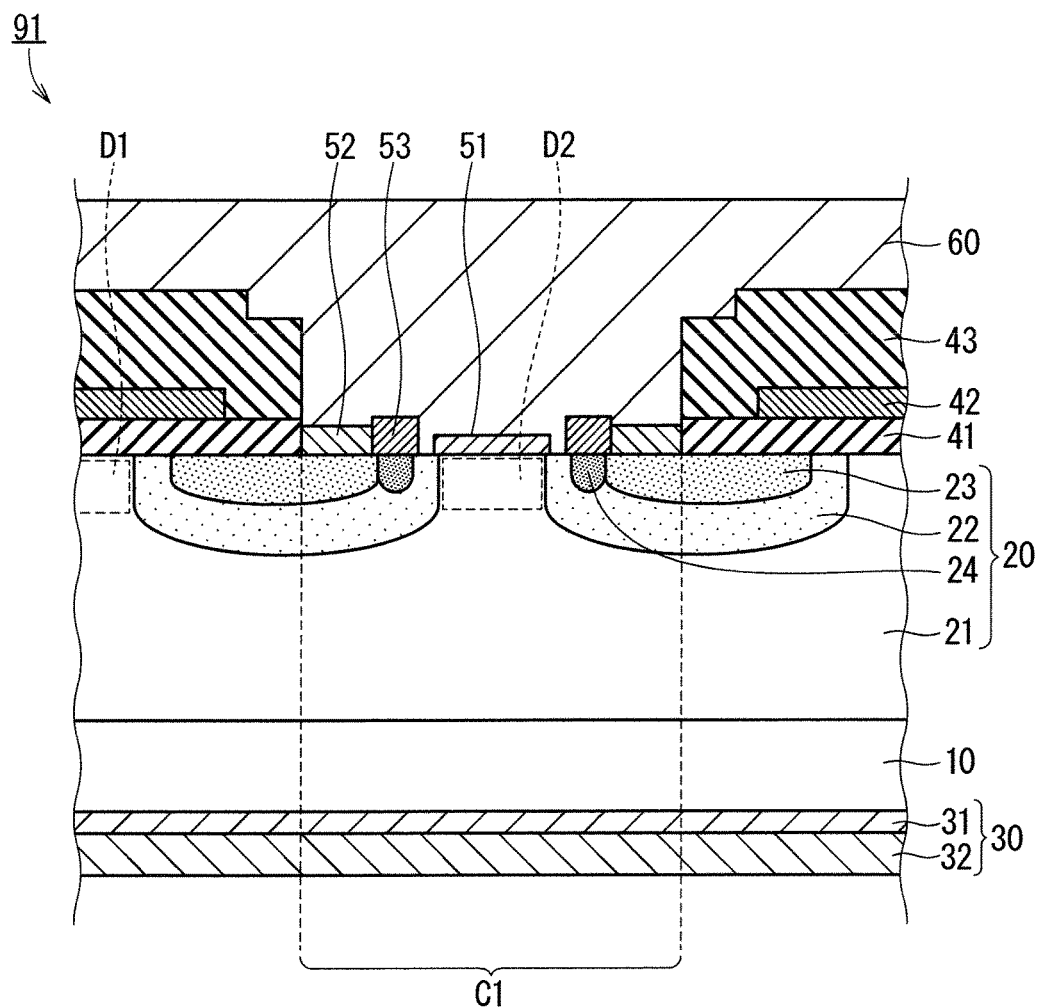
FIG. 1 is a partial cross-sectional view schematically illustrating a configuration of a silicon carbide semiconductor device in a first preferred embodiment of the present invention.

Hereinafter, preferred embodiments of the present invention will be described with reference to the drawings. In the following drawings, the same or corresponding parts will be denoted by the same reference numerals, and description thereof will not always be repeated. It should be noted that the suffix "JOU (in Japanese)" (corresponding to the preposition "on") used in combination with a name of a member means direct or indirect contact between the member and another member, and does not mean an upper direction.

First Preferred Embodiment (Overview)

FIG. 1 is a partial cross-sectional view schematically illustrating a configuration of MOSFET 91 (silicon carbide semiconductor device) in a first preferred embodiment. The MOSFET 91 includes a semiconductor substrate 10, a drain electrode 30, a semiconductor layer 20, a gate insulating film 41, a gate electrode 42, a Schottky electrode 51, a source ohmic electrode 52, a resistor 53, and a source electrode 60. The semiconductor substrate 10 has a substrate lower surface (first substrate surface) and a substrate upper surface (second substrate surface opposite to the first substrate surface), and contains n-type (first conductivity type) impurities. The drain electrode 30 is provided on a substrate lower surface of the semiconductor substrate 10.

The semiconductor layer 20 has a lower surface (first surface) and an upper surface (second surface opposite to the first surface) on the substrate upper surface of the semiconductor substrate 10, and is at least partially made of silicon carbide (SiC). The semiconductor layer 20 includes a drift layer 21, a well region 22, a source region 23, and a well contact region 24. The drift layer 21 is provided on the substrate upper surface of the semiconductor substrate 10, partially forms the upper surface of the semiconductor layer 20, and contains n-type impurities. The well region 22 is provided on the drift layer 21, partially forms the upper surface of the semiconductor layer 20, and contains p-type (second conductivity type different from the first conductivity type) impurities. The source region 23 is provided on the well region 22, is separated from the drift layer 21 by the well region 22, partially forms the upper surface of the semiconductor layer 20, and contains n-type impurities. The well contact region 24 is in contact with the well region 22, partially forms the upper surface of semiconductor layer 20, contains p-type impurities, and has an impurity concentration on the upper surface of the semiconductor layer 20 higher than the impurity concentration on the upper surface of the semiconductor layer 20 in the well region 22.

The gate insulating film 41 covers the well region 22 between the source region 23 and the drift layer 21. The gate electrode 42 is provided on the gate insulating film 41. The Schottky electrode 51 is in contact with the drift layer 21. The source ohmic electrode 52 is in contact with the source region 23 on the upper surface of the semiconductor layer 20. The resistor 53 is in contact with the well contact region 24 on the upper surface of the semiconductor layer 20 and has higher resistance per unit area than the source ohmic electrode 52. The source electrode 60 is electrically connected to each of Schottky electrode 51, source ohmic electrode 52, and resistor 53.

According to the present preferred embodiment, the resistor 53 in contact with the well contact region 24 is provided on the upper surface of the semiconductor layer 20. Electric resistance of the resistor 53 reduces the amount of minority carriers injected into the drift layer 21 through the well contact region 24 at the time of freewheeling operation of the MOSFET 91. Thus, growth of stacking faults of SiC crystals due to recombination of minority carriers is reduced. Therefore, it is possible to reduce deterioration of device performance due to the stacking faults of SiC crystals.

(Details)

Details of the configuration of the MOSFET 91 (FIG. 1) may partially overlap with the description of the above overview, but will be described below.

The semiconductor substrate 10 contains n-type impurities. The semiconductor substrate 10 is typically a single crystal SiC substrate. The drain electrode 30 is provided on a substrate lower surface of the semiconductor substrate 10. The drain electrode 30 may include an ohmic electrode layer 31 ohmically joined to the substrate lower surface of the semiconductor substrate 10 and a protective electrode layer 32 in contact with the ohmic electrode layer 31.

The semiconductor layer 20 is at least partially made of SiC. Typically, the entire semiconductor layer 20 is made of SiC, and in this case, the semiconductor layer 20 is a SiC layer. The semiconductor layer 20 includes a drift layer 21, a well region 22, a source region 23, and a well contact region 24. The semiconductor layer 20 includes a contact region C1 and a region other than that as a planar layout.

The drift layer 21 is provided on the substrate upper surface of the semiconductor substrate 10 and is typically an epitaxial layer provided on the substrate upper surface of the semiconductor substrate 10. The drift layer 21 partially forms the upper surface of the semiconductor layer 20. The drift layer 21 contains n-type impurities. The impurity concentration of the drift layer 21 is preferably lower than the impurity concentration of the semiconductor substrate 10.

The well region 22 is provided on the drift layer 21 and partially forms the upper surface of the semiconductor layer 20. The well region 22 contains p-type impurities. The source region 23 is provided on the well region 22, is separated from the drift layer 21 by the well region 22, and partially forms the upper surface of the semiconductor layer 20. The source region 23 contains n-type impurities.

The well contact region 24 is in contact with the well region 22 in the contact region C1, and partially forms the upper surface of semiconductor layer 20. The well contact region 24 contains p-type impurities, and has an impurity concentration on the upper surface of the semiconductor layer 20 higher than the impurity concentration on the upper surface of the semiconductor layer 20 in the well region 22. In other words, the impurity concentration on the upper surface of the semiconductor layer 20 is higher on the well contact region 24 than on the well region 22. Typically, the impurity concentration at the upper surface of the semiconductor layer 20 is not more than a certain threshold value on the well region 22 and higher than this threshold value on the well contact region 24. In consideration of the overall impurity concentration of each region, the maximum impurity concentration of the well contact region 24 is higher than the maximum impurity concentration of the well region 22, and typically, the minimum impurity concentration of the well contact region 24 is higher than the maximum impurity concentration of the well region 22. The impurity concentration of the well region 22 needs to be high to the extent of preventing a punch through breakdown depending on the impurity concentration of the drift layer 21 and is, for example, $1\times10^{16}/cm^3$ or more and $1\times10^{19}/cm^3$ or less.

The gate insulating film 41 covers the well region 22 between the source region 23 and the drift layer 21 on the upper surface of the semiconductor layer 20. The gate insulating film 41 is preferably an oxide film. The gate electrode 42 is provided on the gate insulating film 41. The gate electrode 42 faces a part of the well region 22 via the gate insulating film 41, thereby forming a channel of the MOSFET. The interlayer insulating film 43 electrically insulates the gate electrode 42 from the source electrode 60 by covering the gate electrode 42 on the gate insulating film 41. The gate insulating film 41 and the interlayer insulating film 43 have an opening (contact hole) on the contact region C1.

The Schottky electrode 51 is in contact with the drift layer 21 on the upper surface of the semiconductor layer 20 in the contact region C1. Thus, the MOSFET 91 is provided with the SBD. When the drift layer 21 contains n-type impurities, the Schottky electrode 51 is preferably made of a metal such as Ti, Mo, Ni, Au, Pt, or Cu. It should be noted that as a modified example, when the drift layer 21 contains p-type impurities, the Schottky electrode 51 is preferably made of a metal such as Au, Cu, or Ni.

The source ohmic electrode 52 is in contact with the source region 23 on the upper surface of the semiconductor layer 20 in the contact region C1. The source ohmic electrode 52 may be separated from the well contact region 24. The source ohmic electrode 52 is preferably made of a silicide such as NiSi, TiSi, PtSi, CoSi, or MoSi.

The resistor 53 is in contact with the well contact region 24 on the upper surface of the semiconductor layer 20. In other words, the resistor 53 covers the well contact region 24 on the surface of the semiconductor layer 20. The resistor 53 has a resistance per unit area higher than that of the source ohmic electrode 52. The resistor 53 is made of a semiconductor or a conductor, and has a resistance per unit area lower than that of each of the gate insulating film 41 and the interlayer insulating film 43. It should be noted that the resistance per unit area means a resistance of an electrical path along the thickness direction (direction perpendicular to the upper surface of the semiconductor layer 20) per unit area on the upper surface of the semiconductor layer 20. The resistance per unit area can be calculated by the product of resistivity and thickness. The resistivity of the resistor 53 is preferably higher than the resistivity of the source ohmic electrode 52. In addition, the resistivity of the resistor 53 is preferably higher than that of the source electrode 60. The resistor 53 is preferably made of polysilicon. The polysilicon may be doped with conductive impurities (donor or acceptor) for adjusting the resistivity.

The source electrode 60 is electrically connected to each of the Schottky electrode 51, the source ohmic electrode 52, and the resistor 53. For that purpose, the source electrode 60 may be in contact with each of the Schottky electrode 51, the source ohmic electrode 52, and the resistor 53. The source electrode 60 may contain an aluminum (Al) atom, and is made of, for example, Al or an Al alloy. The Al alloy is, for example, an aluminum silicon (AlSi) alloy.

In the MOSFET 91, the cell structure illustrated in FIG. 1 is periodically arranged. Therefore, in a cross-sectional view (FIG. 1), the well regions 22 are periodically arranged, and separation regions D1 and D2 made of the drift layer 21 are provided on the surface of the semiconductor layer 20 between the well regions 22. The separation region D1 is positioned outside the contact region C1, and is a region through which current flows via the channel of the MOSFET 91 when the MOSFET 91 is in the on state. The separation region D2 is positioned inside the contact region C1, and is a region through which the current of the SBD formed by the Schottky electrode 51 flows when the MOSFET 91 is in the freewheeling operation. It should be noted that when the MOSFET 91 is in the freewheeling operation, not only the SBD but also a parasitic diode (a pin diode formed by the well region 22 and the drift layer 21) can operate.

Figure 2:
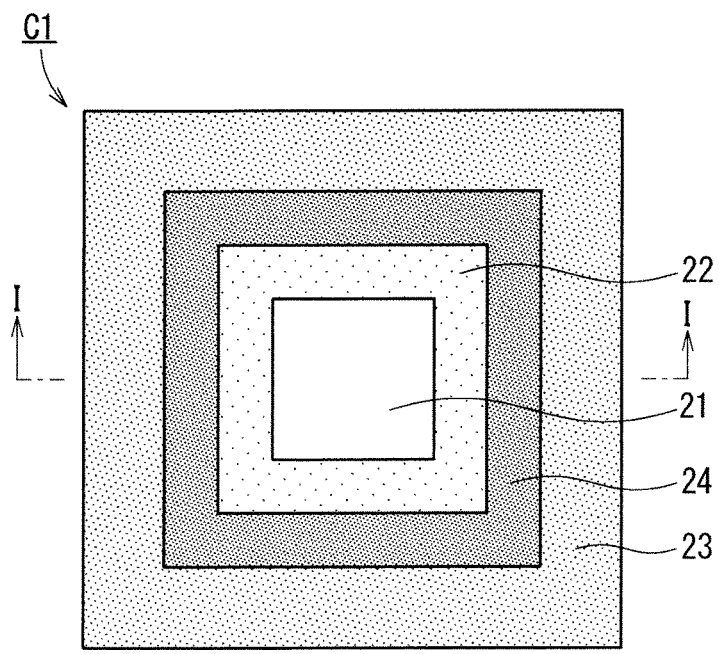
FIG. 2 is a top view schematically illustrating a configuration of a semiconductor layer in a contact region of the silicon carbide semiconductor device in FIG. 1.

FIG. 2 is a top view schematically illustrating a configuration of the semiconductor layer 20 (FIG. 1) in the contact region C1 (FIG. 1). In the present preferred embodiment, the cell structure is a mesh type, and correspondingly, the contact region C1 has a rectangular shape.

Figure 3:
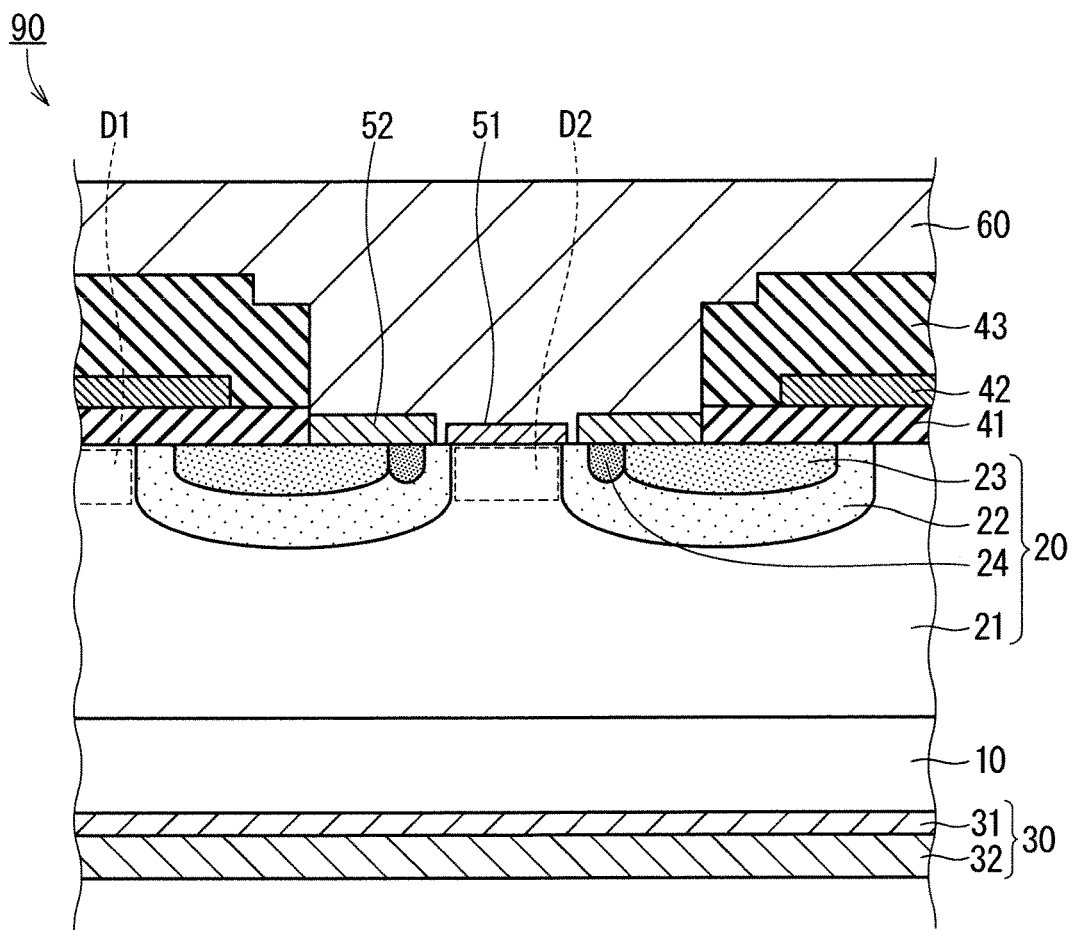
FIG. 3 is a partial cross-sectional view illustrating a configuration of a silicon carbide semiconductor device of a comparative example.

FIG. 3 is a partial cross-sectional view illustrating a configuration of a MOSFET 90 of a comparative example (silicon carbide semiconductor device). In the MOSFET 90, the resistor 53 (FIG. 1) is not provided, and the source ohmic electrode 52 extends over the well contact region 24.

Figure 4:
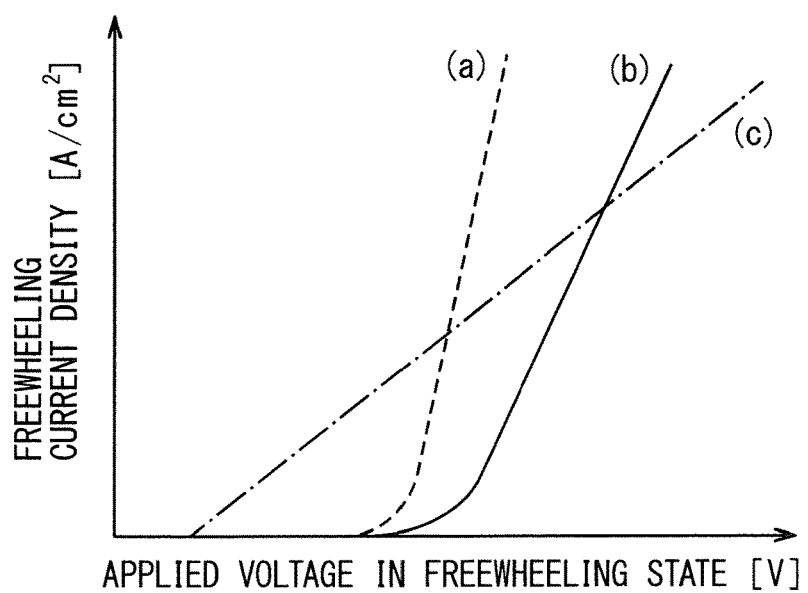
FIG. 4 is a graph schematically illustrating a relationship between the applied voltage and the freewheeling current density at the time of freewheeling operation.

FIG. 4 is a graph schematically illustrating a relationship between the applied voltage and the freewheeling current density at the time of freewheeling operation. In FIG. 4, (a) illustrates an example of characteristics of a pin diode of the MOSFET 90 of the comparative example (FIG. 3), (b) illustrates an example of characteristics of the pin diode of the MOSFET 91 (FIG. 1) of the present preferred embodiment, and (c) illustrates an example of characteristic of an SBD of the MOSFET 90 and the MOSFET 91. The current density is lower in (b) than in (a). That is, the freewheeling current density flowing through the pin diode is reduced more in the present preferred embodiment than in the comparative example. Thus, the amount of minority carriers injected into the drift layer 21 due to the operation of the pin diode is reduced.

According to the present preferred embodiment, the resistor 53 in contact with the well contact region 24 is provided on the upper surface of the semiconductor layer 20. Thus, electric resistance of the resistor 53 reduces the amount of minority carriers injected into the drift layer 21 through the well contact region 24 at the time of freewheeling operation of the MOSFET 91. Thus, growth of stacking faults of SiC crystals due to recombination of minority carriers is reduced. Therefore, it is possible to reduce deterioration of device performance due to the stacking faults of SiC crystals.

Furthermore, the bipolar current flowing into the pin diode being a parasitic diode of the MOSFET 91 is reduced, and the unipolar current flowing into the SBD formed of the Schottky electrode 51 and the drift layer 21 is kept high in a wide applied voltage range. Thus, the recovery loss due to the bipolar operation can be reduced.

If the resistor 53 is made of polysilicon, its resistivity can be easily controlled by adjusting the impurity concentration. In addition, the control of the thickness is also relatively easy in a wide range. Therefore, the resistance per unit area of the resistor 53 can be easily controlled.

When the source electrode 60 contains Al atoms and the well contact region 24 is made of SiC, the resistor 53 disposed between them and made of polysilicon serves as a barrier that inhibits the occurrence of Al spikes in the well contact region 24. Thus, deterioration of device performance can be further reduced.

The source ohmic electrode 52 may be separated from the well contact region 24. In that case, the occurrence of current flowing in the well contact region 24 via the source ohmic electrode 52 can be avoided. Thus, the amount of minority carriers injected into the drift layer 21 via the well contact region 24 at the time of freewheeling operation of the MOSFET 91 is further reduced.

MODIFIED EXAMPLE

It should be noted that the cell structure is not limited to a mesh type, and may be, for example, a stripe type. FIG. 5 is a top view schematically illustrating a configuration of the semiconductor layer 20 (FIG. 1) in the contact region C1S in the case of a modified example having a stripe type, instead of the mesh type, cell structure. In the present preferred embodiment described above, the contact region C1 (FIG. 1) is repeatedly arranged in each of the longitudinal direction and the lateral direction in the planar layout (FIG. 2). In the modified example, a contact region C1S replacing the contact region C1 extends in the longitudinal direction in the planar layout (FIG. 5) and is repeatedly arranged in the lateral direction. The same effect as the above-described effect can be obtained also by the present modified example.

Second Preferred Embodiment (Overview)

Figure 7:
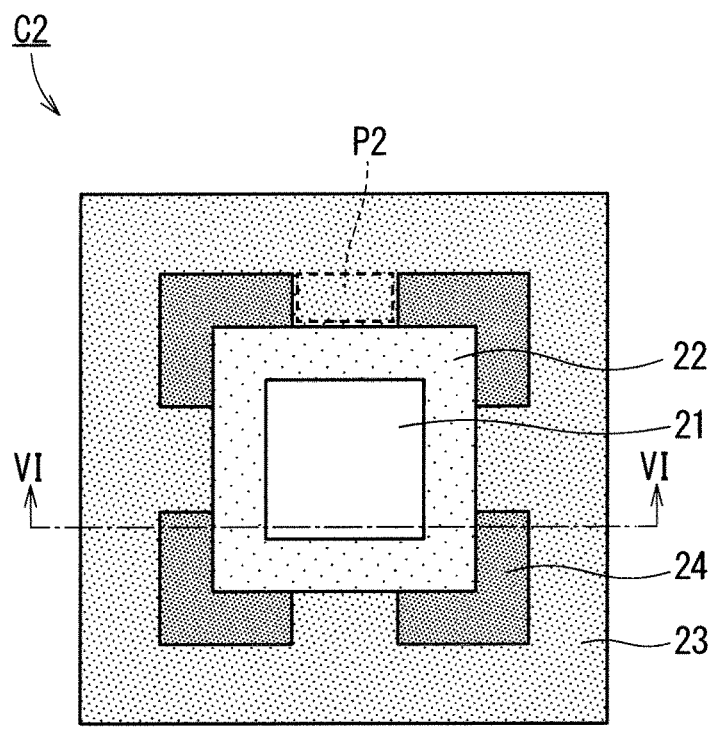
FIG. 7 is a top view schematically illustrating a configuration of a semiconductor layer in a contact region of the silicon carbide semiconductor device in FIG. 6.

FIG. 6 is a partial cross-sectional view schematically illustrating a configuration of MOSFET 92 (silicon carbide semiconductor device) in a second preferred embodiment. FIG. 7 is a top view schematically illustrating a configuration of the semiconductor layer 20 (FIG. 6) in the contact region C2 (FIG. 6). The MOSFET 92 includes a semiconductor substrate 10, a drain electrode 30, a semiconductor layer 20, a gate insulating film 41, a gate electrode 42, a Schottky electrode 51, a source ohmic electrode 52, and a source electrode 60.

The semiconductor substrate 10 has a substrate lower surface (first substrate surface) and a substrate upper surface (second substrate surface opposite to the first substrate surface), and contains n-type (first conductivity type) impurities. The drain electrode 30 is provided on a substrate lower surface of the semiconductor substrate 10.

The semiconductor layer 20 has a lower surface (first surface) and an upper surface (second surface opposite to the first surface) on the substrate upper surface of the semiconductor substrate 10, and is at least partially made of silicon carbide (SiC). The semiconductor layer 20 includes a drift layer 21, a well region 22, a source region 23, and a well contact region 24. The drift layer 21 is provided on the substrate upper surface of the semiconductor substrate 10, partially forms the upper surface of the semiconductor layer 20, and contains n-type impurities. The well region 22 is provided on the drift layer 21, partially forms the upper surface of the semiconductor layer 20, and contains p-type (second conductivity type different from the first conductivity type) impurities. The source region 23 is provided on the well region 22, is separated from the drift layer 21 by the well region 22, partially forms the upper surface of the semiconductor layer 20, and contains n-type impurities. The well contact region 24 is in contact with the well region 22, partially forms the upper surface of semiconductor layer 20, contains p-type impurities, and has an impurity concentration on the upper surface of the semiconductor layer 20 higher than the impurity concentration on the upper surface of the semiconductor layer 20 in the well region 22. The edge of the well region 22 on the upper surface of the semiconductor layer 20 includes a portion in contact with the well contact region 24 and a portion in contact with the source region 23.

The gate insulating film 41 covers the well region 22 between the source region 23 and the drift layer 21. The gate electrode 42 is provided on the gate insulating film 41. The Schottky electrode 51 is in contact with the drift layer 21. The source ohmic electrode 52 is in contact with at least the source region 23 on the upper surface of the semiconductor layer 20. The source electrode 60 is electrically connected to each of the Schottky electrode 51 and the source ohmic electrode 52.

According to the present preferred embodiment, the edge of the well region 22 on the upper surface of the semiconductor layer 20 includes a portion in contact with the source region 23 in addition to the portion in contact with the well contact region 24. Thus, the amount of minority carriers injected into the drift layer 21 via the well contact region 24 at the time of freewheeling operation of the MOSFET 92 is reduced. Thus, growth of stacking faults of SiC crystals due to recombination of minority carriers is reduced. Therefore, it is possible to reduce deterioration of device performance due to the stacking faults of SiC crystals.

(Details)

Details of the configuration of the MOSFET 92 (FIG. 6) may partially overlap with the description of the above overview, but will be described below.

The semiconductor substrate 10 contains n-type impurities. The semiconductor substrate 10 is typically a single crystal SiC substrate. The drain electrode 30 is provided on a substrate lower surface of the semiconductor substrate 10. The drain electrode 30 may include an ohmic electrode layer 31 ohmically joined to the substrate lower surface of the semiconductor substrate 10 and a protective electrode layer 32 in contact with the ohmic electrode layer 31.

The semiconductor layer 20 is at least partially made of SiC. Typically, the entire semiconductor layer 20 is made of SiC, and in this case, the semiconductor layer 20 is a SiC layer. The semiconductor layer 20 includes a drift layer 21, a well region 22, a source region 23, and a well contact region 24. The semiconductor layer 20 includes a contact region C2 and a region other than that as a planar layout.

The drift layer 21 is provided on the substrate upper surface of the semiconductor substrate 10 and is typically an epitaxial layer provided on the substrate upper surface of the semiconductor substrate 10. The drift layer 21 partially forms the upper surface of the semiconductor layer 20. The drift layer 21 contains n-type impurities. The impurity concentration of the drift layer 21 is preferably lower than the impurity concentration of the semiconductor substrate 10.

The well region 22 is provided on the drift layer 21 and partially forms the upper surface of the semiconductor layer 20. The well region 22 contains p-type impurities. The source region 23 is provided on the well region 22, is separated from the drift layer 21 by the well region 22, and partially forms the upper surface of the semiconductor layer 20. The source region 23 contains n-type impurities.

The well contact region 24 is in contact with the well region 22 in the contact region C2, and partially forms the upper surface of semiconductor layer 20. The well contact region 24 contains p-type impurities, and has an impurity concentration on the upper surface of the semiconductor layer 20 higher than the impurity concentration on the upper surface of the semiconductor layer 20 in the well region 22. In other words, the impurity concentration on the upper surface of the semiconductor layer 20 is higher on the well contact region 24 than on the well region 22. Typically, the impurity concentration at the upper surface of the semiconductor layer 20 is not more than a certain threshold value on the well region 22 and higher than this threshold value on the well contact region 24. In consideration of the overall impurity concentration of each region, the maximum impurity concentration of the well contact region 24 is higher than the maximum impurity concentration of the well region 22, and typically, the minimum impurity concentration of the well contact region 24 is higher than the maximum impurity concentration of the well region 22. The impurity concentration of the well region 22 needs to be high to the extent of preventing a punch through breakdown depending on the impurity concentration of the drift layer 21 and is, for example, $1 \times 10^{16}/cm^3$ or more and $1 \times 10^{19}/cm^3$ or less.

The edge of the well region 22 (the outer edge of the well region 22 in FIG. 7) on the upper surface of the semiconductor layer 20 includes a portion in contact with the well contact region 24 and a portion in contact with the source region 23. In the present preferred embodiment, on the upper surface of the semiconductor layer 20, the source region 23 includes a protruding portion P2 penetrating the well contact region 24 to reach the well region 22 as illustrated in FIG. 7. On the upper surface of the semiconductor layer 20, the protruding portion P2 may face the drift layer 21 only via the well region 22. The portion facing the protruding portion P2 as described above of the drift layer 21 may be included in the contact region C2. In particular, in the layout illustrated in FIG. 7, on the upper surface of the semiconductor layer 20, the edge of the well region 22 includes a first edge portion along the longitudinal direction (first direction) and a second edge portion along the lateral direction (the second direction intersecting the first direction). Each of the first edge portion and the second edge portion includes a portion in contact with the well contact region 24 and a portion in contact with the source region 23.

The gate insulating film 41 covers the well region 22 between the source region 23 and the drift layer 21 on the upper surface of the semiconductor layer 20. The gate insulating film 41 is preferably an oxide film. The gate electrode 42 is provided on the gate insulating film 41. The gate electrode 42 faces a part of the well region 22 via the gate insulating film 41, thereby forming a channel of the MOSFET. The interlayer insulating film 43 electrically insulates the gate electrode 42 from the source electrode 60 by covering the gate electrode 42 on the gate insulating film 41. The gate insulating film 41 and the interlayer insulating film 43 have an opening (contact hole) on the contact region C2.

The Schottky electrode 51 is in contact with the drift layer 21 on the upper surface of the semiconductor layer 20 in the contact region C2. Thus, the MOSFET 91 is provided with the SBD. When the drift layer 21 contains n-type impurities, the Schottky electrode 51 is preferably made of a metal such as Ti, Mo, Ni, Au, Pt, or Cu. It should be noted that as a modified example, when the drift layer 21 contains p-type impurities, the Schottky electrode 51 is preferably made of a metal such as Au, Cu, or Ni.

The source ohmic electrode 52 is in contact with at least the source region 23 on the upper surface of the semiconductor layer 20 in the contact region C2. Preferably, the source ohmic electrode 52 is also in contact with the well contact region 24, whereby the potential of the well contact region 24 can be brought closer to the source potential more sufficiently. The source ohmic electrode 52 is preferably made of a silicide such as NiSi, TiSi, PtSi, CoSi, or MoSi.

The source electrode 60 is electrically connected to each of the Schottky electrode 51 and the source ohmic electrode 52. For that purpose, the source electrode 60 may be in contact with each of the Schottky electrode 51 and the source ohmic electrode 52. The source electrode 60 may contain an aluminum (Al) atom, and is made of, for example, Al or an Al alloy. The Al alloy is, for example, an aluminum silicon (AlSi) alloy.

In the MOSFET 92, the cell structure illustrated in FIG. 6 is periodically arranged. Therefore, in a cross-sectional view (FIG. 6), the well regions 22 are periodically arranged, and separation regions D1 and D2 made of the drift layer 21 are provided on the surface of the semiconductor layer 20 between the well regions 22. The separation region D1 is positioned outside the contact region C2, and is a region through which current flows via the channel of the MOSFET 92 when the MOSFET 92 is in the on state. The separation region D2 is positioned inside the contact region C2, and is a region through which the current of the SBD formed by the Schottky electrode 51 flows when the MOSFET 92 is in the freewheeling operation. It should be noted that when the MOSFET 92 is in the freewheeling operation, not only the SBD but also a parasitic diode (a pin diode formed by the well region 22 and the drift layer 21) can operate.

According to the present preferred embodiment, the edge of the well region 22 (the outer edge of the well region 22 in FIG. 7) on the upper surface of the semiconductor layer 20 includes a portion in contact with the source region 23 in addition to the portion in contact with the well contact region 24. Thus, the amount of minority carriers injected into the drift layer 21 via the well contact region 24 at the time of freewheeling operation of the MOSFET 92 is reduced. Thus, growth of stacking faults of SiC crystals due to recombination of minority carriers is reduced. Therefore, it is possible to reduce deterioration of device performance due to the stacking faults of SiC crystals.

Specifically, on the upper surface of the semiconductor layer 20, the source region 23 includes a protruding portion P2 penetrating the well contact region 24 to reach the well region 22 as illustrated in FIG. 7. Thus, the well contact regions 24 are divided into portions separated from each other by the source region 23. Therefore, the amount of minority carriers injected into the drift layer 21 via the well contact region 24 at the time of freewheeling operation of the MOSFET 92 is reduced.

Furthermore, the bipolar current flowing into the pin diode being a parasitic diode of the MOSFET 92 is reduced, and the unipolar current flowing into the SBD formed of the Schottky electrode 51 and the drift layer 21 is kept high in a wide applied voltage range. Thus, the recovery loss due to the bipolar operation can be reduced.

MODIFIED EXAMPLE

Figure 8:
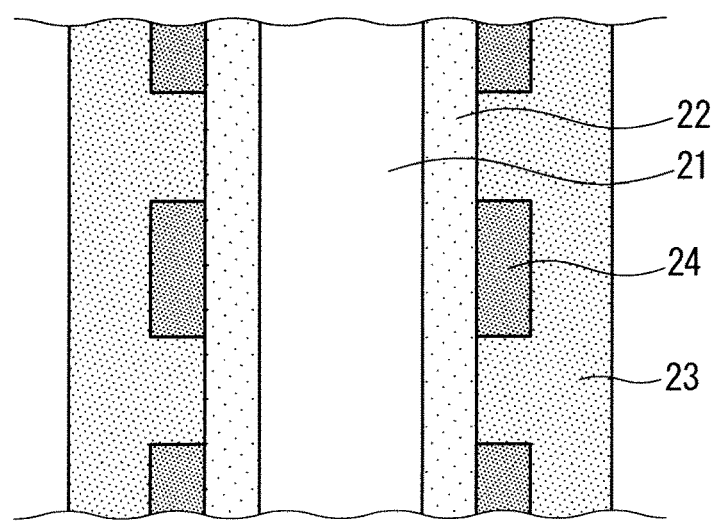
FIG. 8 is a top view illustrating a modified example in FIG. 7.

It should be noted that the cell structure is not limited to a mesh type, and may be, for example, a stripe type. FIG. 8 is a top view schematically illustrating a configuration of the semiconductor layer 20 (FIG. 6) in the contact region C2S in the case of a modified example having a stripe type, instead of the mesh type, cell structure. In the present preferred embodiment described above, the contact region C2 (FIG. 6) is repeatedly arranged in each of the longitudinal direction and the lateral direction in the planar layout (FIG. 7). In the modified example, a contact region C2S replacing the contact region C2 extends in the longitudinal direction in the planar layout (FIG. 8) and is repeatedly arranged in the lateral direction. In the present modified example, as illustrated in FIG. 8, on the upper surface of the semiconductor layer 20, the edge of the well region 22 includes an edge portion along the longitudinal direction (first direction). A portion in which the well region 22 is in contact with the well contact region 24 and a portion in which the well region 22 is in contact with the source region 23 are repeated along the edge portion. The same effect as the effect according to the present preferred embodiment can be obtained also by the present modified example.

Third Preferred Embodiment

The MOSFET (silicon carbide semiconductor device) in a third preferred embodiment includes a contact region having a layout different from the layout of the contact region C2 (FIG. 7: second preferred embodiment). Since the configuration other than this is substantially the same as the configuration of the second preferred embodiment (FIGS. 6 and 7) described above, the configuration of the contact region in the present preferred embodiment will be described below.

Figure 9:
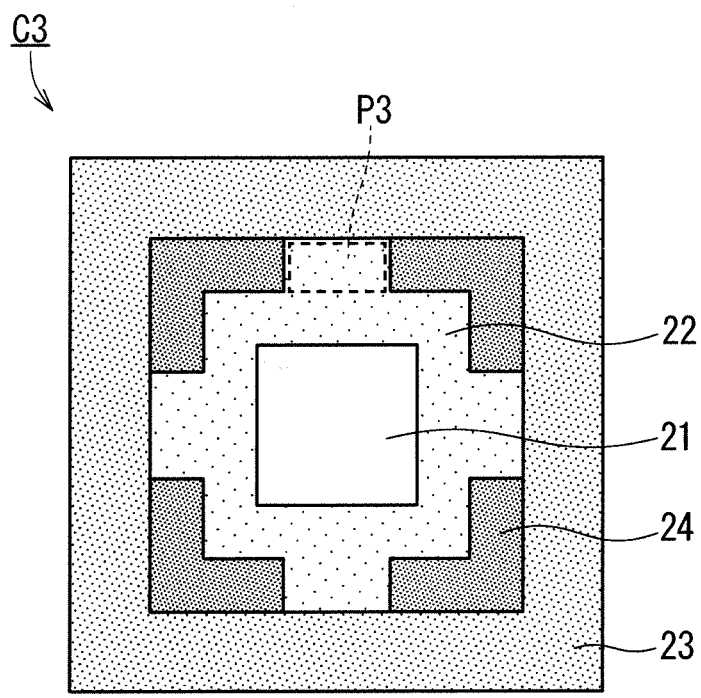
FIG. 9 is a top view schematically illustrating a configuration of a semiconductor layer in a contact region of a silicon carbide semiconductor device in a third preferred embodiment of the present invention.

FIG. 9 is a top view schematically illustrating a configuration of the semiconductor layer 20 (FIG. 6) in the contact region C3 in the third preferred embodiment. On the upper surface of the semiconductor layer 20, the well region 22 includes a protruding portion P3 penetrating the well contact region 24 to reach the source region 23. On the upper surface of the semiconductor layer 20, only the well region 22 may be disposed between the protruding portion P3 of the well region 22 and the drift layer 21. The portion facing the protruding portion P3 as described above of the drift layer 21 may be included in the contact region C2. In particular, in the layout illustrated in FIG. 9, on the upper surface of the semiconductor layer 20, the edge of the source region 23 includes a first edge portion along the longitudinal direction (first direction) and a second edge portion along the lateral direction (the second direction intersecting the first direction). Each of the first edge portion and the second edge portion includes a portion in contact with the well contact region 24 and a portion in contact with the well region 22.

According to the present preferred embodiment, on the upper surface of the semiconductor layer 20, the well region 22 includes a protruding portion P3 penetrating the well contact region 24 to reach the source region 23. Thus, the well contact regions 24 are divided into portions separated from each other by the well region 22. Therefore, the amount of minority carriers injected into the drift layer 21 via the well contact region 24 at the time of freewheeling operation of the MOSFET 92 is reduced.

Furthermore, the bipolar current flowing into the pin diode being a parasitic diode of the MOSFET is reduced, and the unipolar current flowing into the SBD formed of the Schottky electrode 51 and the drift layer 21 (FIG. 6) is kept high in a wide applied voltage range. Thus, the recovery loss due to the bipolar operation can be reduced.

MODIFIED EXAMPLE

Figure 10:
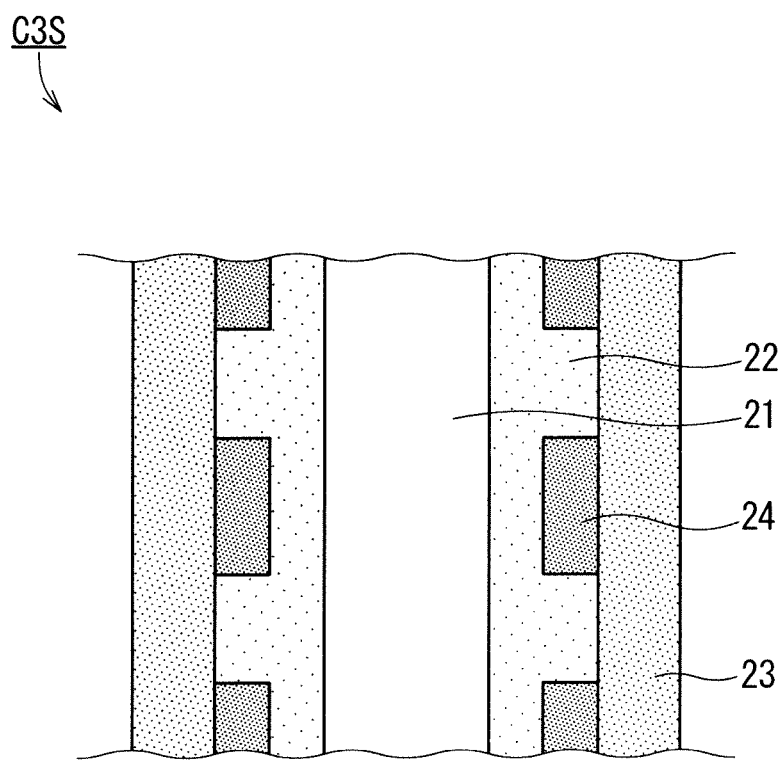
FIG. 10 is a top view illustrating a modified example in FIG. 9.

It should be noted that the cell structure is not limited to a mesh type, and may be, for example, a stripe type. FIG. 10 is a top view schematically illustrating a configuration of the semiconductor layer 20 (FIG. 6) in the contact region C3S in the case of a modified example having a stripe type, instead of the mesh type, cell structure. In the present preferred embodiment described above, the contact region C2 is repeatedly arranged in each of the longitudinal direction and the lateral direction in the planar layout (FIG. 7). In the modified example, a contact region C3S replacing the contact region C3 extends in the longitudinal direction in the planar layout (FIG. 10) and is repeatedly arranged in the lateral direction. In the present modified example, as illustrated in FIG. 10, on the upper surface of the semiconductor layer 20, the edge of the source region 23 includes an edge portion along the longitudinal direction (first direction). Along the edge portion, a portion in which the source region 23 is in contact with the well contact region 24 and a portion in which the source region 23 is in contact with the well region 22 are repeated. The same effect as the effect according to the present preferred embodiment can be obtained also by the present modified example.

Fourth Preferred Embodiment

The present preferred embodiment is obtained by applying the MOSFET (silicon carbide semiconductor devices) according to the above first to third preferred embodiments to a power conversion apparatus. Although the application of the MOSFET according to the first to third preferred embodiments is not limited to a specific power conversion apparatus, in the following, the case where the MOSFET according to the first to third preferred embodiments is applied to a three-phase inverter will be described as a fourth preferred embodiment.

Figure 11:
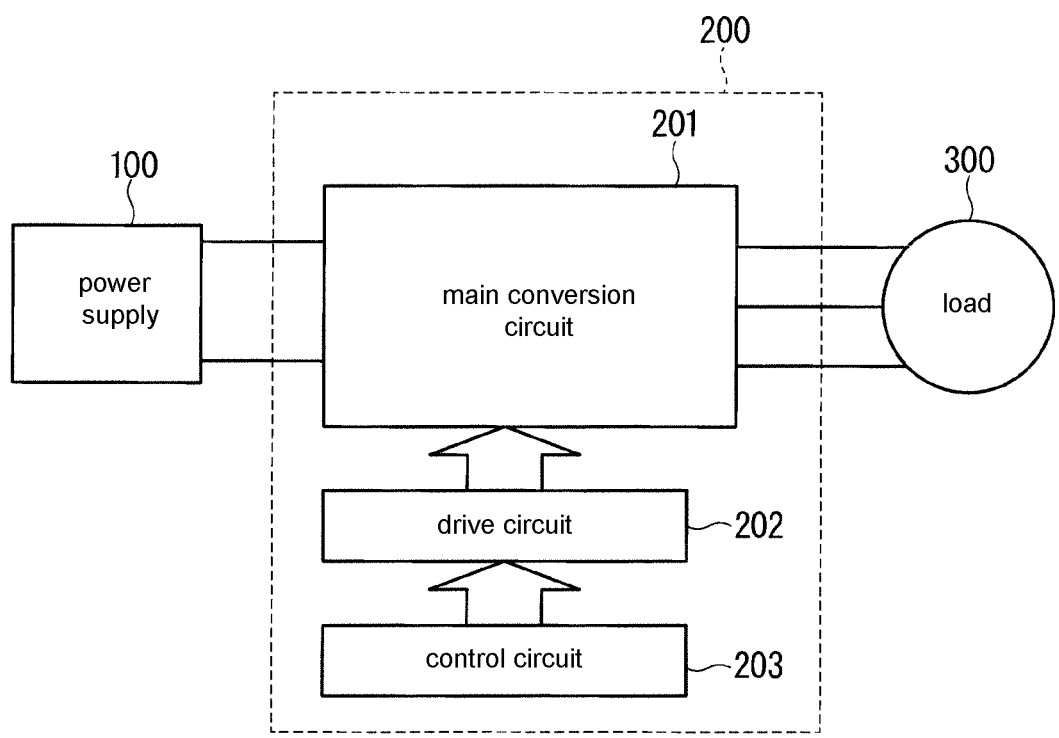
FIG. 11 is a block diagram schematically illustrating a configuration of a power conversion apparatus in a fourth preferred embodiment of the present invention.

FIG. 11 is a block diagram illustrating a configuration of a power conversion system to which the power conversion apparatus according to the present preferred embodiment is applied.

The power conversion system illustrated in FIG. 11 includes a power supply 100, a power conversion apparatus 200, and a load 300. The power supply 100 is a direct current power supply, and supplies direct current power to the power conversion apparatus 200. The power supply 100 can include various components, for example, a DC system, a solar cell, and a storage battery, or may include a rectifier circuit or an AC/DC converter connected to an AC system. In addition, the power supply 100 may include a DC/DC converter that converts DC power output from the DC system into predetermined power.

The power conversion apparatus 200 is a three-phase inverter connected between the power supply 100 and the load 300, converts DC power supplied from the power supply 100 into AC power, and supplies AC power to the load 300. As illustrated in FIG. 11, the power conversion apparatus 200 includes a main conversion circuit 201 for converting DC power into AC power to output the AC power, a drive circuit 202 for outputting a drive signal for driving each switching element of the main conversion circuit 201, and a control circuit 203 for outputting a control signal for controlling the drive circuit 202 to the drive circuit 202.

The load 300 is a three-phase motor driven by AC power supplied from the power conversion apparatus 200. It should be noted that the load 300 is not limited to a specific application, is a motor mounted on various electric apparatuses, and is used as a motor for a hybrid vehicle, an electric vehicle, a railway vehicle, an elevator, or an air conditioner, for example.

Hereinafter, the details of the power conversion apparatus 200 will be described. The main conversion circuit 201 includes a switching element in which a freewheeling diode is built in (not shown), converts DC power supplied from the power supply 100 into AC power by switching the switching element, and supplies AC power to the load 300. Although there are various specific circuit configurations of the main conversion circuit 201, the main conversion circuit 201 according to the present preferred embodiment is a two-level three-phase full bridge circuit, and can include six switching elements and six freewheeling diodes antiparallel to the respective switching elements. The MOSFET according to any one of the first to third preferred embodiments described above is applied to each switching element of the main conversion circuit 201. Of the six switching elements, every two switching elements are connected in series to form upper and lower arms, and each upper and lower arms forms a corresponding phase (U phase, V phase, or W phase) of the full bridge circuit. Then, the output terminals of the upper and lower arms, that is, the three output terminals of the main conversion circuit 201 are connected to the load 300.

The drive circuit 202 generates drive signals for driving the switching elements of the main conversion circuit 201 and supplies the drive signals to the control electrodes of the switching elements of the main conversion circuit 201. Specifically, in accordance with a control signal from a control circuit 203 described below, a drive signal for turning on the switching element and a drive signal for turning off the switching element are output to the control electrodes of each of the switching elements. When the switching element is kept to be in the ON state, the drive signal is a voltage signal not less than the threshold voltage of the switching element (ON signal), and when the switching element is kept to be in the OFF state, the drive signal is a voltage signal not more than the threshold voltage of the switching element (OFF signal).

The control circuit 203 controls the switching elements of the main conversion circuit 201 so that a desired power is supplied to the load 300. Specifically, based on the power to be supplied to the load 300, the time during which each switching element of the main conversion circuit 201 is to be turned on (ON time) is calculated. For example, the main conversion circuit 201 can be controlled by pulse width modulation (PWM) control for modulating the ON time of the switching element according to the voltage to be output. Then, in order that at each time point, the ON signal is output to the switching element to be turned on and the OFF signal is output to the switching element to be turned off, control instructions (control signals) are output to the drive circuit 202. In accordance with the control signal, the drive circuit 202 outputs an ON signal or an OFF signal to the control electrode of each switching element as a drive signal.

In the power conversion apparatus according to the present preferred embodiment, since the MOSFET according to the first to third preferred embodiments is applied as a switching element of the main conversion circuit 201, deterioration of device performance can be reduced.

In the present preferred embodiment, an example in which the MOSFET according to the first to third preferred embodiments is applied to a two-level three-phase inverter is described, but the application of the MOSFET according to the first to third preferred embodiments is not limited to this, and can be applied to various power conversion apparatuses. In the present preferred embodiment, a two-level power conversion apparatus is used, but a three-level or multi-level power conversion apparatus may be used, and when power is supplied to a single-phase load, the semiconductor device according to the first to third preferred embodiments may be applied to a single-phase inverter. In addition, when power is supplied to a DC load or the like, the MOSFET according to the first to third preferred embodiments may be applied to a DC/DC converter or an AC/DC converter.

In addition, the power conversion apparatus to which the MOSFET according to the first to third preferred embodiments is applied is not limited to the case where the load described above is a motor, can also be used as, for example, a power supply apparatus for electric discharge machines, laser beam machines, induction heating cookers, or non-contact feeding systems, and furthermore, can also be used as a power conditioner of solar power generation systems, electric storage systems, or the like.

It should be noted that in the first to third preferred embodiments above, the case where the first conductivity type is n-type and the second conductivity type is p-type is described in detail, but n-type and p-type may be interchanged with each other. Thus, a p-channel MOSFET can be obtained instead of the n-channel type. In the present invention, each preferred embodiment may be freely combined, and each preferred embodiment may be appropriately modified, or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:
1. A silicon carbide semiconductor device comprising:
a semiconductor substrate having a first substrate surface and a second substrate surface opposite to the first substrate surface, the semiconductor substrate containing first conductivity type impurities;
a drain electrode provided on the first substrate surface of the semiconductor substrate;
a semiconductor layer having a first surface on the second substrate surface of the semiconductor substrate and a second surface opposite to the first surface, the semiconductor layer at least partially made of silicon carbide, the semiconductor layer including
  a drift layer provided on the second substrate surface of the semiconductor substrate, the drift layer partially forming the second surface of the semiconductor layer, the drift layer containing the first conductivity type impurities,
  a well region provided on the drift layer, the well region partially forming the second surface of the semiconductor layer, the well region containing second conductivity type impurities different from the first conductivity type impurities,
  a source region provided on the well region, the source region separated from the drift layer by the well region, the source region partially forming the second surface of the semiconductor layer, the source region containing the first conductivity type impurities, and
  a well contact region in contact with the well region, the well contact region partially forming the second surface of the semiconductor layer, the well contact region containing the second conductivity type impurities, the well contact region having an impurity concentration at the second surface higher than an impurity concentration at the second surface of the well region;
a gate insulating film covering the well region between the source region and the drift layer;
a gate electrode provided on the gate insulating film;
a Schottky electrode in contact with the drift layer;
a source ohmic electrode in contact with the source region on the second surface of the semiconductor layer;
a resistor in contact with the well contact region on the second surface of the semiconductor layer, the resistor having higher resistance per unit area than the source ohmic electrode; and
a source electrode electrically connected to each of the Schottky electrode, the source ohmic electrode, and the resistor.

2. The silicon carbide semiconductor device according to claim 1, wherein
the resistor is made of polysilicon.

3. The silicon carbide semiconductor device according to claim 2, wherein
the source electrode contains an aluminum atom.

4. The silicon carbide semiconductor device according to claim 1, wherein
the source ohmic electrode is separated from the well contact region.

5. A silicon carbide semiconductor device comprising:
a semiconductor substrate having a first substrate surface and a second substrate surface opposite to the first substrate surface, the semiconductor substrate containing first conductivity type impurities;
a drain electrode provided on the first substrate surface of the semiconductor substrate;
a semiconductor layer having a first surface on the second substrate surface of the semiconductor substrate and a second surface opposite to the first surface, the semiconductor layer at least partially made of silicon carbide, the semiconductor layer including
a drift layer provided on the second substrate surface of the semiconductor substrate, the drift layer partially forming the second surface of the semiconductor layer, the drift layer containing the first conductivity type impurities,
a well region provided on the drift layer, the well region partially forming the second surface of the semiconductor layer, the well region containing second conductivity type impurities different from the first conductivity type impurities,
a source region provided on the well region, the source region separated from the drift layer by the well region, the source region partially forming the second surface of the semiconductor layer, the source region containing the first conductivity type impurities, and
a well contact region in contact with the well region, the well contact region partially forming the second surface of the semiconductor layer, the well contact region containing the second conductivity type impurities, the well contact region having an impurity concentration at the second surface higher than an impurity concentration at the second surface of the well region, an edge of the well region on the second surface of the semiconductor layer including a portion in contact with the well contact region and a portion in contact with the source region;
a gate insulating film covering the well region between the source region and the drift layer;
a gate electrode provided on the gate insulating film;
a Schottky electrode in contact with the drift layer;
a source ohmic electrode in contact with at least the source region on the second surface of the semiconductor layer; and
a source electrode electrically connected to each of the Schottky electrode and the source ohmic electrode.

6. The silicon carbide semiconductor device according to claim 5, wherein
the source ohmic electrode is in contact with the well contact region.

7. The silicon carbide semiconductor device according to claim 5, wherein
on the second surface of the semiconductor layer, the source region includes a protruding portion penetrating the well contact region to reach the well region.

8. The silicon carbide semiconductor device according to claim 7, wherein
on the second surface of the semiconductor layer, the edge of the well region includes a first edge portion along a first direction, and a second edge portion along a second direction intersecting the first direction, and
each of the first edge portion and the second edge portion includes a portion in contact with the well contact region and a portion in contact with the source region.

9. The silicon carbide semiconductor device according to claim 7, wherein
on the second surface of the semiconductor layer, the edge of the well region includes an edge portion along a first direction, and
a portion in which the well region is in contact with the well contact region and a portion in which the well region is in contact with the source region are repeated along the edge portion.

10. The silicon carbide semiconductor device according to claim 5, wherein
on the second surface of the semiconductor layer, the well region includes a protruding portion penetrating the well contact region to reach the source region.

11. The silicon carbide semiconductor device according to claim 10, wherein
on the second surface of the semiconductor layer, an edge of the source region includes a first edge portion along a first direction, and a second edge portion along a second direction intersecting the first direction, and
each of the first edge portion and the second edge portion includes a portion in contact with the well contact region and a portion in contact with the well region.

12. The silicon carbide semiconductor device according to claim 10, wherein
on the second surface of the semiconductor layer, an edge of the source region includes an edge portion along a first direction, and
along the edge portion, a portion in which the source region is in contact with the well contact region and a portion in which the source region is in contact with the well region are repeated.

13. A power conversion apparatus including the silicon carbide semiconductor device according to claim 1, comprising:
a main conversion circuit that includes the silicon carbide semiconductor device, the main conversion circuit being configured to convert input power and output a converted result;
a drive circuit configured to output, to the semiconductor device, a drive signal for driving the semiconductor device; and
a control circuit configured to output, to the drive circuit, a control signal for controlling the drive circuit.

14. A power conversion apparatus including the silicon carbide semiconductor device according to claim 5, comprising:
a main conversion circuit that includes the silicon carbide semiconductor device, the main conversion circuit being configured to convert input power and output a converted result;
a drive circuit configured to output, to the semiconductor device, a drive signal for driving the semiconductor device; and
a control circuit configured to output, to the drive circuit, a control signal for controlling the drive circuit.

* * * * *